US006409837B1

(12) United States Patent
Hillman

(10) Patent No.: US 6,409,837 B1
(45) Date of Patent: *Jun. 25, 2002

(54) PROCESSING SYSTEM AND METHOD FOR CHEMICAL VAPOR DEPOSITION OF A METAL LAYER USING A LIQUID PRECURSOR

(75) Inventor: Joseph T. Hillman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/231,357

(22) Filed: Jan. 13, 1999

(51) Int. Cl.⁷ .............................................. C23C 16/00
(52) U.S. Cl. ..................... 118/712; 118/719; 118/726; 118/729
(58) Field of Search ................................ 118/719, 726, 118/729, 712

(56) References Cited

U.S. PATENT DOCUMENTS

| 4,819,579 | A | | 4/1989 | Jenkins ........................ 118/728 |
| 5,314,574 | A | * | 5/1994 | Takahashi ................... 118/719 |
| 5,383,970 | A | * | 1/1995 | Asabe ......................... 118/726 |
| 5,505,781 | A | | 4/1996 | Omori et al. ............... 118/726 |
| 5,888,304 | A | * | 3/1999 | Umotoy ....................... 118/729 |
| 5,945,162 | A | | 8/1999 | Senateur et al. .......... 427/148.1 |
| 5,999,886 | A | * | 12/1999 | Martin ......................... 702/31 |
| 6,183,564 | B1 | * | 2/2001 | Reynolds ..................... 118/719 |

FOREIGN PATENT DOCUMENTS

| DE | 198 08 163 C1 | 2/1998 |
| EP | 0548990 A2 | 6/1993 |
| FR | 2707671 | 1/1995 |
| JP | 63250465 | 10/1988 |
| JP | 05267182 | 10/1993 |
| JP | 07273052 | 10/1995 |
| JP | 09082653 | 3/1997 |

OTHER PUBLICATIONS

O'Hanlon, A User's Guide to Vacuum Technology 2$^{nd}$ Ed. John Wiley & Sons, NY pp 252–272, 1989.*

(List continued on next page.)

Primary Examiner—Richard Bueker
(74) Attorney, Agent, or Firm—Wood, Herron, & Evans, LLP

(57) ABSTRACT

A system for depositing a layer of metal onto a substrate through a chemical vapor deposition process comprises a process chamber for receiving and processing a substrate. A vaporizer element is positioned in a vaporization space of the chamber adjacent the process space, and is operable for being heated to a temperature sufficient to vaporize a liquid metal-containing precursor, such as a copper precursor, into a process gas for delivery to said process space. A nozzle is positioned opposite the vaporizer element and is connectable to a liquid metal-containing precursor supply to atomize and direct the liquid metal-containing precursor into the vaporization space and against the vaporizer element. A gas-dispersing element is positioned between the vaporization space and the process space to disperse the gas into the process space and proximate the substrate.

28 Claims, 3 Drawing Sheets

OTHER PUBLICATIONS

Norman, J.A.T. et al., New OMCVD Precursors for Selective Copper Metallization, J. de Physique IV, vol. 1, C2–271–C2–278, Sep. 1991.

Norman, John A.T. et al., Chemical Additives for Improved Copper Chemical Vapour Deposition Processing, Thin Solid Films 262, 46–51, 1995.

Hochberg, Arthur K., User's Guide for: CupraSelect Coper Precursor: Insallation and Troubleshooting, Schumacher Research and Development, undated 29 pgs.

Norman, John A.T., Roberts, David A. and Hochberg, Arthur K., Surface and Reactor Effects on Selective Copper Deposition from Cu(hfac)tmvs, Mat. Res. Soc. Symp. Proc. vol. 282, 347–352, 1993.

Parmeter, J.E., et al., Characterization of Thin Copper Films Grown via Chemical Vapor Deposition Using Liquid Coinjection of TMVS and Cu (tmvs), Amer. Vacuum Society, 130–136. 1995.

Hochberg, A.K., Norman,J.A.T., and Roberts, D.A., Chemical Additives for Improved Copper CVD Processing Using (HFAC) CU (TMVS), Mat. Res. Soc. Symp. Proc. vol. V–10, 79–86. 1994.

Norman, J.A.T. et al., A New Metal–Organic Chemical Vapor Deposition Process for Selective Copper Metallization, Mat. Sci. & Engr., B17, 87–92, 1993.

Norman, John A.T., Roberts, David A. & Hochberg, Arthur K., New Precursors for Blanket and Selective CVD Copper, Schumacher, unnumbered, 1969.

* cited by examiner

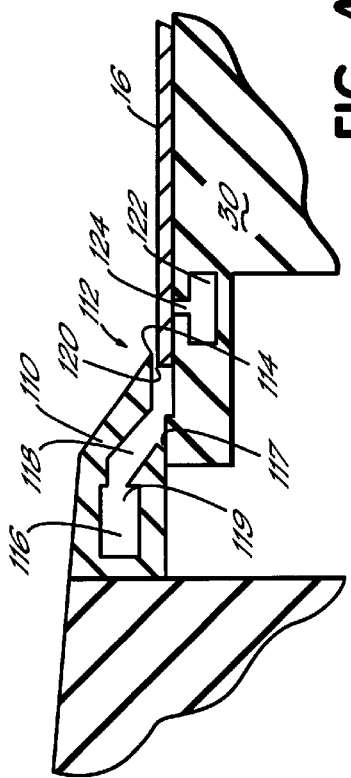
FIG. 3
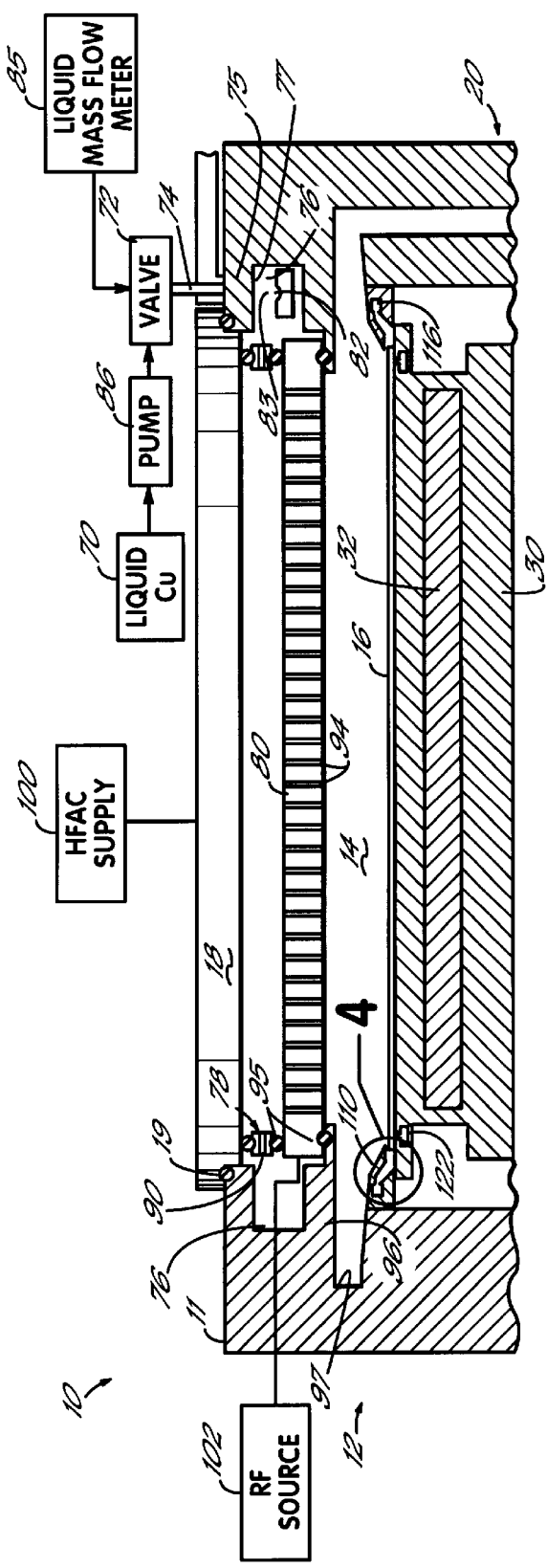
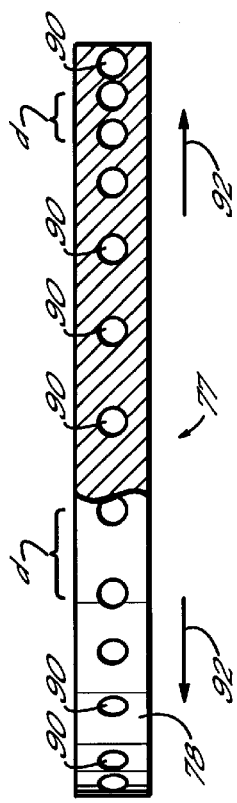
FIG. 4
FIG. 1A

PROCESSING SYSTEM AND METHOD FOR CHEMICAL VAPOR DEPOSITION OF A METAL LAYER USING A LIQUID PRECURSOR

FIELD OF THE INVENTION

This invention relates generally to semiconductor processing and more specifically to the deposition of a metal layer, such as copper, within a chemical vapor deposition (CVD) system, using a liquid precursor.

BACKGROUND OF THE INVENTION

In the formation of integrated circuits (ICs) it is often necessary to deposit thin material layers or films, such as films containing metal and metalloid elements, upon the surface of a substrate, such as a semiconductor wafer. One purpose of such thin films is to provide conductive and ohmic contacts for the ICs and to yield conductive or barrier layers between the various devices of an IC. For example, a desired film might be applied to the exposed surface of a contact hole formed in an insulating layer of a substrate, with the film passing through the insulating layer to provide plugs of conductive material for the purpose of making electrical connections across the insulating layer.

One well known process for depositing such films is chemical vapor deposition (CVD), in which a film is deposited on a substrate using chemical reactions between various constituent or reactant gases, referred to generally as process gases. In a CVD process, reactant gases are pumped into a process space of a reaction chamber containing a substrate. The gases react in the process space proximate a surface of the substrate, resulting in the deposition of a film of one or more reaction by-products on the surface. Other reaction by-products that do not contribute to the desired film on the exposed substrate surfaces are then pumped away or purged by a vacuum system coupled to the reaction chamber.

One variation of the CVD process, which is also widely utilized in IC fabrication, is a plasma-enhanced CVD process or PECVD process in which one or more of the reactant process gases is ionized into a gas plasma to provide energy to the reaction process. PECVD is desirable for lowering the processing temperatures of the substrate and reducing the amount of thermal energy usually necessary for a proper reaction with standard CVD. In PECVD, RF electrical energy is delivered to the process gas or gases to form and sustain the plasma, and therefore, less thermal energy is needed for the reaction.

The dimensions of the IC devices formed by such film deposition techniques have continued to decrease, while the density of such devices on the substrate wafers being processed are increasing. Particularly, IC devices having physical features that are sub-micron in dimension are becoming more common. Furthermore, the semiconductor industry has increasingly desired that such small IC devices have interconnects which are highly conductive. Whereas aluminum alloys and tungsten have been traditionally utilized for conductive interconnects within IC devices, copper has become popular for such interconnects within sub-micron devices. It has been found that IC devices utilizing copper interconnects rather than aluminum or tungsten interconnects, exhibit greater reliability and speed.

For chemical vapor deposition of copper, it has become common to utilize a liquid copper-containing precursor designated in the art as an (hfac) Cu (TMVS) precursor. As is well known in the art, such a precursor, in liquid form, includes a hexa-fluoracetylacetonate (HFAC) organic chemical ligand combined with trimethylvinylsilane (TMVS). The liquid copper precursor must then be vaporized prior to introduction into a CVD processing chamber as a process gas. The use of such metal precursors with organic molecular ligands is broadly referred to as metal-organic chemical vapor deposition or MOCVD.

Processing systems presently available for MOCVD of copper have several particular drawbacks. First, while some systems rely upon bubbling or evaporating the precursor to the gaseous state, other systems rely upon the use of a commercially-available direct liquid injection (DLI) system for delivery of the MOCVD copper precursor to the process chamber. One such DLI system is the DLI-25B available from MKS Instruments of Andover, Mass. DLI systems use liquid from a reservoir or ampule and then heat the liquid in the delivery line as it passes to a process chamber. Pumps and flow controllers are used to manage liquid flow. Such DLI systems are generally not specifically developed for MOCVD copper precursor introduction. In fact, most such DLI systems were developed for delivering water vapor within a process chamber. As a result, processing systems utilizing commercially available DLI systems often result in copper condensation or even deposition within the actual lines and flow control components of the DLI system which hinders introduction of the gaseous precursor to a process chamber. For example, condensation in the line may occur past the point at which the precursor vaporizes but before the process chamber. In addition to the inefficient delivery of the gaseous precursor, particle generation may result within the DLI system which may contaminate a substrate being processed. Deposition within the DLI system accompanied by particle generation will ultimately clog the DLI system and render it ineffective until it may be disassembled and cleaned. As will be appreciated, such factors are undesirable within a processing system as they decrease the efficiency and throughput of the processing system and require additional maintenance.

Another drawback to copper MOCVD systems, as with other CVD systems incorporated within a larger, multi-chamber processing tool, is the inability to control the transmission of CVD reaction by-products from the CVD processing chamber to a substrate handler which interfaces with the numerous processing chambers of the processing tool. The inability to control the by-product flow into the handler often precludes the use of a copper MOCVD chamber in combination in the same processing tool with a physical vapor deposition (PVD) chamber, because such PVD processes are very sensitive to background contamination which is generated by the CVD reaction by-products. With respect to copper deposition, such cross contamination is a significant drawback, because one of the most effective diffusion barriers for copper is tantalum nitride (TaN) which is deposited by a PVD method. Presently, TaN cannot be effectively deposited by CVD techniques. Accordingly, a PVD—TaN processing chamber and methodology cannot be effectively integrated with a MOCVD—Cu processing chamber in a single processing tool unless the contaminating reaction byproducts from the MOCVD chamber can be prevented from entering the PVD chamber.

Still another drawback with current copper MOCVD processing systems results from the fact that such systems allow deposition of copper up to the outer edge of the substrate. Generally, the barrier layer (e.g. TaN) deposited beneath the copper layer on the substrate, which is deposited by a PVD method as discussed above, will not extend to the edge of the wafer. Therefore, a portion of the copper layer which extends around the outer substrate edge, will not be deposited entirely upon a barrier layer. As a result, at the edges of the substrate, the copper will be free to diffuse into the silicon wafer, which may affect the operation of the IC devices formed on the substrate.

Accordingly, it is an objective of the invention to improve MOCVD deposition techniques in general and Cu MOCVD deposition techniques in particular, and thus to present a processing system which addresses the above-discussed drawbacks of current systems.

Specifically, it is an objective of the invention to uniformly introduce a gaseous copper precursor into a process chamber while reducing particle generation from such precursor introduction and reducing clogging associated with prior art precursor introduction systems.

It is another objective of the present invention to reduce cross contamination between adjacent processing systems which are necessary for the various steps associated with IC fabrication from a substrate wafer.

It is still another objective of the present invention to prevent the deposition of copper on portions of the substrate which are not sufficiently covered with a diffusion barrier layer to thus prevent diffusion of the copper into a silicon substrate.

These objectives and other objectives are addressed by the present invention discussed in greater detail hereinbelow.

SUMMARY OF THE INVENTION

The system of the present invention addresses the above objectives and provides an improved system for depositing a layer of metal onto a substrate through a chemical vapor deposition process utilizing a liquid, metal-containing precursor. Preferably, the precursor contains copper, and the inventive system may be utilized to deposit a layer of copper onto a substrate.

In accordance with one embodiment of the present invention, the system comprises a process chamber for receiving a substrate in a process space. A vaporizer element is positioned in a vaporization space in the chamber, adjacent to the process space, and is heated to a temperature sufficient to vaporize the liquid, metal-containing precursor into a process gas. A supply of a liquid, metal-containing precursor, such as a copper-containing precursor, is coupled to a nozzle, and the nozzle atomizes the liquid and directs the atomized liquid precursor against the vaporizer element. Temperature control of the vaporizer element maintains the element at a temperature sufficient to vaporize the liquid precursor into a process gas. The supply of precursor, lines delivering the liquid to the process chamber, and the vaporizer element are maintained at room temperature to prevent vaporization, condensation, and possibly deposition in the delivery system.

The process gas is dispersed into the process space proximate the substrate. A gas-dispersing element is positioned between the vaporization space and the process space to disperse the gas. In one embodiment of the invention, a vapor distribution ring having a series of radial holes is utilized. In another embodiment of the invention, a gas-dispersing showerhead may be utilized. Alternatively, both the vapor distribution ring and showerhead may be utilized in conjunction to provide uniform distribution of vaporized process gas into the process space.

The nozzle is coupled to the supply of liquid precursor through a valve which may be controlled by a liquid mass flow meter which controls the valve to deliver the desired liquid precursor flow to the vaporizer element for achieving a desired process gas pressure within the process chamber. Alternatively, a controllable pump might be utilized between the precursor supply and valve for delivering the controlled precursor flow to the nozzle and vaporizer element. With the present invention, all of the components within the precursor delivery system, including the supply, valve, nozzle, and flow control components, such as the flow meter or pump, are maintained at room temperature. In that way, the liquid precursor is only vaporized within the vaporization space of the process chamber proximate the vaporizer element and proximate the process space. As such, deposition within the liquid precursor delivery system is avoided prior to vaporization of the liquid within the vaporization space and subsequent clogging of the delivery system is reduced. Furthermore, since the precursor is not vaporized until the vaporization space inside of the process chamber, the precursor does not have the chance to vaporize and subsequently condense, further interrupting the uniform flow of precursor to the process chamber.

In accordance with another aspect of the present invention, the system includes a temperature control system which is operably coupled to heating elements within the process chamber, and is also operably coupled to the vaporizer element. The temperature control system differentially heats the vaporizer element and the process chamber heating element, such that the vaporizer element is maintained at a different temperature than the process chamber heating element and the chamber walls. More specifically, the temperature control system maintains the vaporizer element at a desired vaporization temperature, such as 60° C. for a copper precursor, to ensure proper vaporization of the precursor and to reduce condensation within the vaporization space. The chamber heating element is maintained at a temperature sufficient to heat the internal walls of the chamber above the vaporization temperature of the vaporizer element in order to prevent condensation of the liquid precursor within the process chamber, yet below an upper temperature range to prevent deposition on the chamber walls. Utilizing a copper precursor, the temperature control system is operable to maintain the temperature of the chamber walls approximately in the range of 60–90° C., which simultaneously reduces both condensation of the vaporized precursor in the process space, and also reduces deposition on the chamber walls within the process space.

In accordance with another aspect of the present invention, the system comprises an edge exclusion ring positioned within the process space and configured for surrounding the peripheral edge of a substrate placed within a process space. The edge exclusion ring is preferably formed of an electrically insulating material and prevents deposition at the substrate peripheral edge. The ring might also be metal or an insulator-coated metal. The edge exclusion ring overlaps the peripheral edge of the substrate and creates a small gap between the ring and the substrate edge. In one embodiment of the invention, the ring includes a gas passage which is coupled to a supply of an inert gas, such as argon. The passage is configured for directing gas inwardly of the ring and against the peripheral edge of the substrate within the small gap between the ring and substrate edge. In that way, the inert gas keeps the gap between the ring and substrate edge free of the process gas and thus prevents deposition at the substrate peripheral edge.

In an alternative embodiment of the invention, the gas passage may be formed within a substrate stage on which the substrate rests and proximate the outer peripheral edge of the stage. The inert gas stream would then blow upwardly and around the edge of the substrate, and through the gap between the substrate edge and the edge exclusion ring to reduce process gas in that space and thereby prevent deposition at the substrate peripheral edge.

For preventing cross contamination between multiple process chambers within a multi-chamber processing tool, the inventive system incorporates a buffer chamber defining a buffer space therein and positioned beneath the process chamber. A passage is formed between the process and buffer chamber for moving a substrate on the substrate stage between a process position in the process chamber and a buffer position in the buffer chamber. A sealing mechanism engages the passage and is operable to seal the passage and isolate the process space from the buffer space when the substrate stage is in the buffer position. A pumping system is coupled to the buffer chamber for purging the buffer space of contaminants which may leak therefrom and into another process chamber through a common transfer chamber. The buffer chamber incorporates cryogenic panels positioned on adjacent walls of the buffer chamber which are operable for capturing and thereby pumping gas from the buffer chamber to reduce contaminants therein. The cryogenic panels are coupled alternatively to a source of refrigerant or an expander head for rapidly cooling the panels to affect the gas pumping. Preferably, a sensing system is included within the buffer chamber to detect undesired gases to be removed in order to prevent access to the buffer chamber through a transfer chamber until the buffer chamber has been sufficiently evacuated of gas contaminants. In that way, the inventive system may be incorporated within a multi-chamber processing tool with other contaminant-sensitive processing chambers, such as a PVD chamber.

Other features and advantages of the present invention will become more readily apparent from the Detailed Description below.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

FIG. 1A is a side view of a vapor distribution ring in accordance with the principles of the present invention;

FIG. 3 is a cross-sectional view of an alternative embodiment of the process chamber of the invention;

FIG. 4 is an enlarged section of FIG. 3 showing the edge exclusion ring.

DETAILED DESCRIPTION

Figure 1:
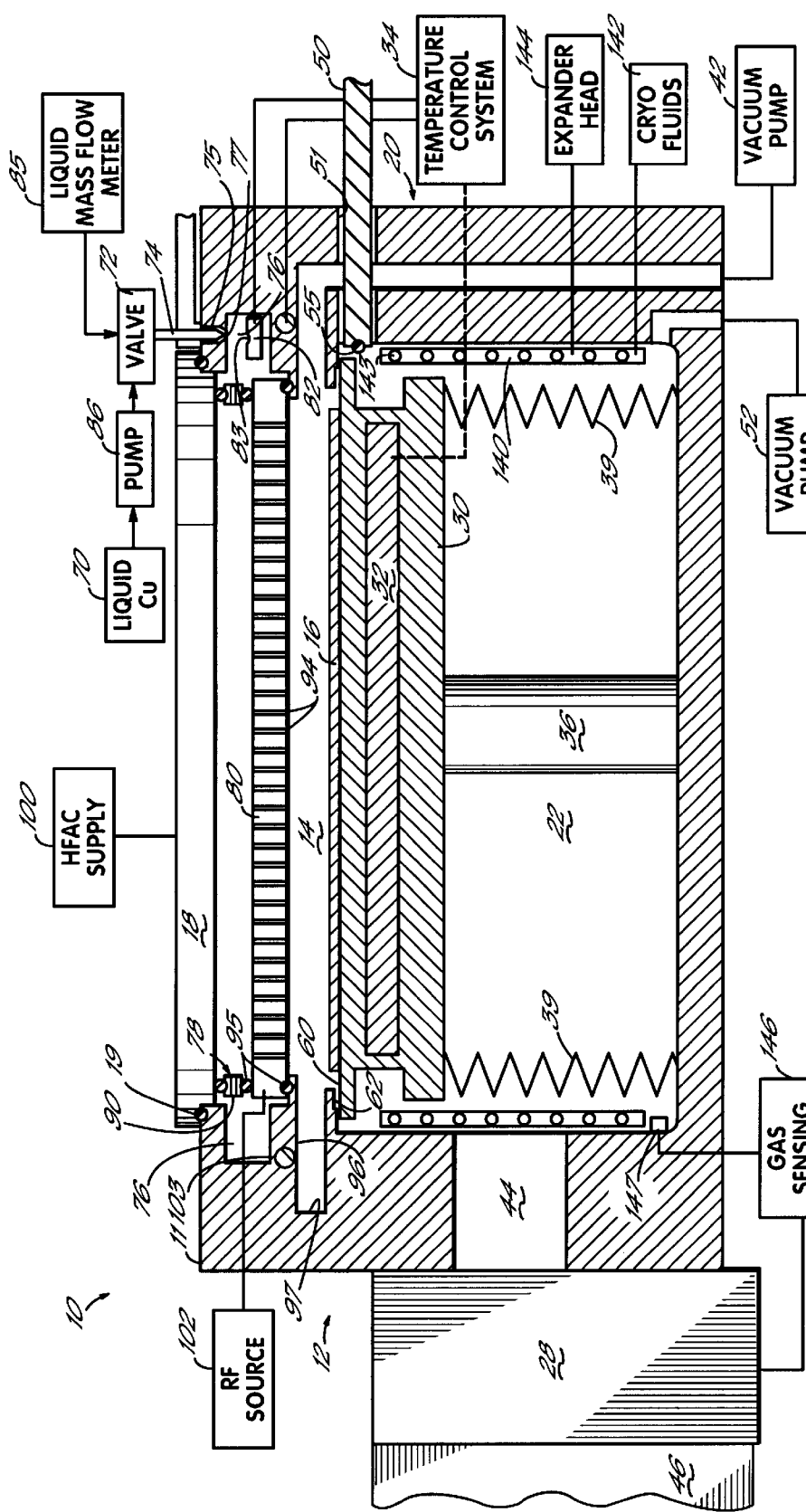
FIG. 1 is a side cross-sectional view of a process chamber in accordance with the principles of the present invention showing a substrate in the process position.

FIG. 1 illustrates a system 10 in accordance with the principles of the present invention which may be utilized to deposit a metal layer onto a substrate utilizing a liquid, metal-containing precursor which is vaporized into a gas and then utilized within a chemical vapor deposition process. System 10 is specifically useful for depositing a layer of copper onto a substrate utilizing a copper-containing liquid precursor and an MOCVD process. To that end, system 10 includes a housing 11 defining a process chamber 12 including a process space 14 therein for receiving and processing a substrate 16. The housing 11 is formed of a suitable metal such as stainless steel. A process gas or gases are introduced into process space 14 for chemical vapor deposition of a layer, and particularly a metal layer, onto a substrate 16. Housing 11 includes a lid 18 with an appropriate seal 19 for sealing the housing and process chamber 12 and process space 14. Positioned beneath the process chamber 12, is a buffer chamber 20 forming a buffer space 22 therein (see FIG. 2.). As illustrated in the Figures, the process chamber 12 and buffer chamber 20 may be formed from a single housing 11, or alternatively, may be separate chambers appropriately coupled together in a sealed fashion so that a vacuum may be sustained in the chambers. The buffer space 22 is coupled to the process space 14 by a passage 26 formed in the housing 11 between the buffer chamber and process chamber. The passage 26 is formed and dimensioned so that the substrate 16 may be moved between the buffer space 22 and the process space 14. In FIG. 1, the substrate 14 is shown in the process space 16 while in FIG. 2, the substrate space is shown in the buffer space 22.

Figure 2:
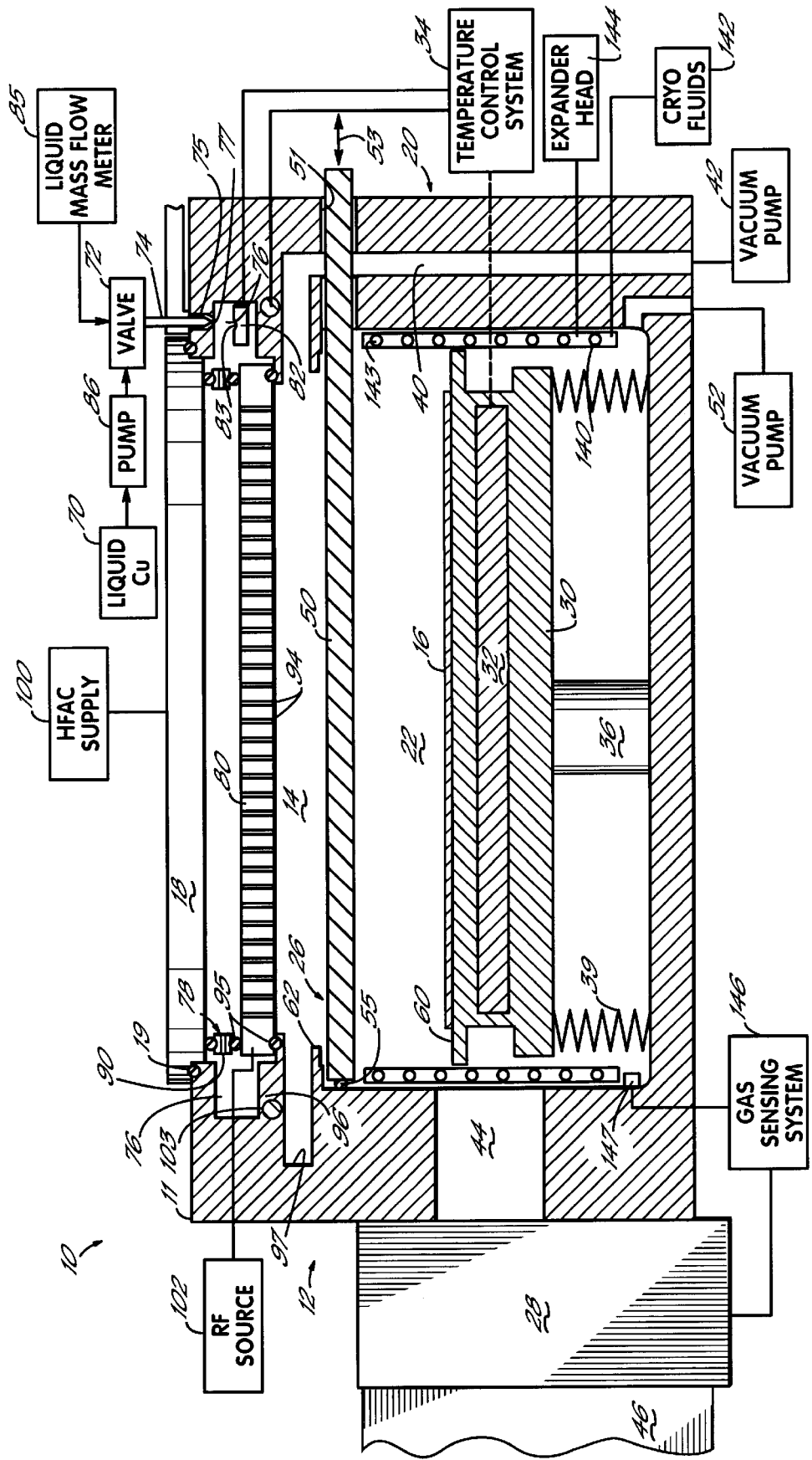
FIG. 2 is a cross-sectional view, similar to FIG. 1 showing the substrate in a buffer position.

For moving substrate 16 between the process space and buffer space, a movable substrate stage 30, such as a susceptor, is operable for moving vertically between the positions shown in FIGS. 1 and 2. Herein the position illustrated in FIG. 2 wherein the substrate 16 is in the buffer space 22, is referred to as the "first position" or "buffer position." When substrate stage 30 has been moved to the position in FIG. 1, it is in the "second position" or "process position." In that way, the substrate 16 may be moved to the process position for processing and into the buffer position for buffering to prevent cross contamination within a multi-chamber system utilizing several processing chambers, as discussed further hereinbelow.

Substrate stage or susceptor 30 includes a heating element 32, which is shown embedded in the susceptor within the figures. The heating element 32 is coupled to a temperature control system 34 for heating the susceptor 30 and thus heating substrate 16 during the deposition process as is well known in the CVD art. Stage 30 includes a suitable driving mechanism 36, such as a moveable shaft, for mechanically moving the substrate stage between the process and buffer positions. The mechanism 36 is illustrated as a shaft in the figures, but may be any suitable mechanism known in the art for vertically or horizontally moving a substrate stage or susceptor. Mechanism 36 will be appropriately sealed such as with bellows 39, so that a vacuum may be introduced into the process and buffer spaces in accordance with a CVD process.

Process space 14 is coupled through passage 40 in housing 11 to a vacuum pump 42 for producing a vacuum within the process space. For introducing a substrate into the buffer space 22, the housing 11 includes an appropriately formed passage 44 which communicates with buffer space 22 and through which a substrate may be moved from a transfer chamber 46 using an appropriate substrate transport device (not shown). For example, system 10 may be coupled to a plurality of other processing systems (not shown) within a multi-chamber processing tool through the interface of a common transfer chamber 46. One such processing tool may be an Eclipse System which has been sold in the past by Materials Research Corporation (now sold by Tokyo Electron Arizona, Inc.) An isolation valve 28 is positioned between the transfer chamber 46 and buffer chamber 20 for isolating the transfer chamber 26 from the buffer space 22 and process space 14 to reduce cross contamination between the system 10 and any other processing systems coupled with system 10 through a common transfer chamber 46.

For providing further isolation between the process chamber 12 and the transfer chamber 46, a sealing mechanism 50 is positioned proximate the passage 26 and interfaces with passage 26 to open and close the passage and selectively isolate the buffer chamber 20 from the process chamber 12. For example, one suitable sealing mechanism 50 is a gate valve as shown in the Figures. The sealing mechanism moves through an appropriately formed passage 51 in housing 1, and translates in the direction of arrow 53. Accordingly, gate valve 50 is coupled to an appropriate translating mechanism (not shown). For processing, gate valve 50 is moved to the open position, as shown in FIG. 1. After the substrate is processed and removed from the process chamber, the gate valve is closed (FIG. 2). The buffer chamber may then be purged of contaminants using an appropriate vacuum pump 52. The gate valve assembly 50 is closed also to seal the passage 26 whenever the isolation valve 28 is open so that when the substrate 16 is being handled between the transfer chamber 46 and the buffer chamber 20, the process chamber 12 is sealed from the buffer chamber 20.

In that way, the buffer chamber 20 will be interfacing with either the process chamber 12 or the transfer chamber 46, but not both at the same time. When the substrate 16 is moved by substrate stage 30 to the process space 14, the isolation valve 28 is closed and the gate valve assembly 50 is again opened to provide access to the process space 14. The gate valve 50 includes an appropriate sealing structure 55 which seals with a side wall of housing 11 as appropriate to present a seal between the buffer space 22 and process space 14. When substrate stage 30 is moved to the process position, as illustrated in FIG. 1, a peripheral edge 60 of the susceptor 30 forms an appropriate seal with a peripheral shoulder 62 formed in the housing 11 between the process and buffer spaces. In that way, process space 14 may be sealed and suitably brought to the necessary vacuum pressure for a CVD process. In accordance with one principal of the present invention, the buffer chamber 20 includes a variety of other pumping mechanisms which may be utilized to sufficiently purge the buffer space 22 to prevent any cross contamination with other process systems or chambers coupled to a common transfer chamber 46, as discussed further hereinbelow. Further details regarding a buffer chamber construction and the integration of a CVD processing chamber within a multi-chamber system are disclosed in U.S. patent application Ser. No. 09/190,870 filed on Nov. 12, 1998, and entitled "Buffer Chamber and Method for Integrating Physical and Chemical Vapor Deposition Chambers Together in a Processing System," which application is incorporated herein by reference in its entirety.

The system 10 of the present invention is utilized for depositing a metal layer onto a substrate, utilizing a liquid metal-containing precursor. Specifically, the inventive system 10 is directed to depositing a layer of copper onto a substrate utilizing a liquid copper-containing precursor. As noted, in IC fabrication, copper layers have achieved widespread popularity in the industry due to their conductive properties. Furthermore, for the deposition of such copper layers, liquid precursors have achieved somewhat widespread use. Such precursors are organo-metallic liquids, and the process for layer deposition is referred to as Metal Organic Chemical Vapor Deposition, or MOCVD. One such copper organo-metallic liquid precursor is referred to as (hfac) Cu (TMVS). The precursor utilizes hexafluoroactylacetonate (hfac), which is an organic ligand which attaches to the copper. The TMVS or trimethylvinylsilane is utilized to stabilize the copper organic molecule when the precursor is either a liquid or gas under moderate temperature conditions (i.e. less than 130° C.). Under CVD conditions at more elevated substrate temperatures (greater than 130° C.), TMVS disassociates from the copper molecule, which will then yield a copper metal and a by-product in a very clean metallization process. The process does not require any additional reactive agents or process gases to effect deposition. Generally, such deposition is effected on conductors, rather than insulators, so that selective deposition may be utilized. When depositing such copper layers, a barrier film (not shown), such as tantalum, titanium nitride, or tungsten is utilized between the copper layer and the silicon substrate 16.

System 10 utilizes a supply or ampule 70 of a liquid, metal-containing precursor. In a preferred embodiment, the precursor is a copper-containing precursor, such as (hfac) Cu (TMVS). Once such suitable precursor is CupraSelect available from Schumacher, of Carlsbad, California. Supply 70 is coupled through a valve 72 to a nozzle 74. Nozzle 74 extends into an appropriately formed opening 75 in housing 11 to introduce the precursor from supply 70 into a vaporization space 76 adjacent to the process space 14. The vaporization space 76 is formed by a channel within housing 24 which extends around the process space 14 and somewhat peripheral thereto as shown in FIGS. 1 and 2. As illustrated in the Figures, the vaporization space 76 extends around the chamber above the process space 14 and around the outside of gas-dispersing elements 78 and 80. As discussed further hereinbelow, the gas-dispersing elements 78, 80 disperse the gas formed from the liquid precursor into the process space 14 for the deposition process.

Positioned within space 76 is a vaporizer element 82 which is operable for being heated to a temperature sufficient to vaporize the liquid precursor into a gas for delivery to the process space. One suitable vaporizer element is a metal vaporizer plate formed of a conductive metal such as aluminum which may be heated to a controlled temperature. The vaporizer plate is connected to temperature control system 34 for selective heating of the plate. Nozzle 74 is configured to be operable to atomize the liquid precursor as it is directed therethrough from supply 70. The atomized precursor then strikes the heated vaporizer plate 82 and is vaporized or evaporated into a process gas. The gas is then dispersed through elements 78 and 80 into the process space 14. Nozzle 74 is formed in accordance with well-known nozzle principles to atomize the precursor at the outlet 77 of the nozzle. The atomized precursor is then readily vaporized by plate 82. In one embodiment of the invention, the plate will include an indentation 83 formed therein for capturing any precursor which is not immediately vaporized or which recondenses proximate the plate 82 before it is again vaporized.

To control the flow of precursor, valve 72 may be coupled to a liquid mass flow meter 85 by known techniques for monitoring the flow of liquid precursor through nozzle 74 and into the vaporization space 76. Valve 72 is selectively controlled by flow meter 85 for delivering the proper amount of precursor through nozzle 74. Alternatively, a controllable pump 86 might be utilized and coupled directly between the supply 70 and valve 72. The pump 86 independently controls the flow of liquid precursor, and thus valve 72 would simply be opened or closed, depending upon the desired delivery of precursor. One suitable pump, which may be calibrated for precise liquid delivery is a liquid chromatography pump available from MKS of Andover, Mass. The valve 72, nozzle 74, and pump 86 all are maintained at room temperature for keeping the liquid precursor from vaporizing prematurely. In a preferred embodiment, the precursor is vaporized only within space 76 and then delivered to the process space 14 through gas-dispersing elements 78 and 80. In that way, the precursor does not vaporize and condense to any great extent prior to injection into space 76 through the nozzle 74. Deposition and condensation in the precursor delivery system is thereby reduced so that clogging and maintenance of the system are reduced.

Once the precursor has been vaporized into a gas, the gas is delivered to process space 14 by elements 78 and 80. Element 78 is a vapor distribution ring which has a series of radial holes to deliver the vapor. The radial holes 90 are formed to extend from space 76 to an area above the element 80 to disperse the vapor. Referring to FIG. 1A, a cross-section of element 78 is illustrated. Element 78 is in the form of a ring having a plurality of radial holes 90 extending therethrough. The holes receive vapor from space 76 and disperse the vapor above element 80 to be thereby dispersed into the process space 14. The gaseous vapor or precursor passes through the holes 90 and the ring-shaped element 78 preferably extends around the periphery of the process space 14 for uniformly introducing the process gas to one side of element 80.

In one embodiment of the invention, the holes are arranged around the ring element 78 in order to compensate for pressure differences within space 76. Specifically, there is a pressure drop in space 76 such that the pressure proximate the outlet 77, indicated by a reference arrow in FIG. 1A, is greater at one portion of ring element 78 than at a portion 180° away from outlet 77. That is, the farther away from outlet 77, the lower the vapor pressure. To compensate for the pressure differential and to create a uniform gas delivery around the ring element 78, the space in between the various holes around the ring is varied. Referring to FIG. 1A, the number or density of holes near the outlet 77 is less than the number or density of holes approximately 180° away from outlet 77. To provide for uniform gas distribution, in accordance with the principles of the present invention, the spacing between the holes is made smaller progressing in either direction away from the outlet 77, as illustrated by reference numeral 92. In that way, the greater number of holes 90 will compensate for the reduced gas pressure proximate those holes, in order to achieve uniform gas distribution through the ring element 78. The hole number and exact hole placement on ring element 78 will vary depending upon the particular process and parameters, such as the precursor flow rate and the pressure within the process space 76. Furthermore, the variations in spacing d between the holes may be adjusted around the ring element for a desired uniform gas distribution. The greater the precursor flow rate and vapor pressure, the less the number of holes 90 that will be necessary for delivering the proper amount of gas at the proper pressure within process space 14.

Another gas dispersing element which may be utilized for uniform distribution of gas in the process space is a showerhead 80 which includes apertures 94 formed therein for uniformly distributing gas from the vaporization space. Gas is introduced above the showerhead 80 from ring 78 or directly from space 76 if the ring 78 is not utilized. The use of showerheads for gas distribution is well known, and thus the apertures 94 may be sized and dimensioned in accordance with known principles to uniformly deliver the gas to the process space.

The ring 78 and showerhead 80 may be considered redundant elements in some processes and, therefore, one or the other may be selectively eliminated for a particular process. Alternatively, both elements may be used for more uniform gas distribution at the substrate 16.

In the preferred embodiment of the invention, vaporization space 76 will be essentially sealed from process space 14 such that any gas generated within space 76 must pass through the gas-dispersing elements 78, 80. To that end, a series of seals 95 are positioned appropriately between the gas-dispersing elements 78 and 80, the lid 18, and a shoulder 96 of the housing 12. In that way, when the lid 18 is closed, a seal is formed to force all vapor from space 76 through the elements 78 and 80, and into the processing space 14. The lid 18, ring 78, and showerhead 80, are all stacked upon shoulder 96 of the housing 24. Another such stacking arrangement for a showerhead which may be suitable for utilization in accordance with the principles of the present invention is illustrated in U.S. patent application Ser. No. 09/057,818, filed Apr. 9,1998 and entitled "Stacked Showerhead Assembly for Delivering Gases and RF Power to a Reaction Chamber" which pending application is incorporated herein by reference, in its entirety.

As noted above, copper deposition from a liquid precursor more readily adheres to metallic conductive surfaces than to insulative surfaces. Accordingly, various conductive elements within chamber 20, in addition to substrate 16, may become undesirably coated with a copper layer during a deposition process. For example, metallic gas-dispersing elements 78, 80, as well as side walls 97 of housing 11 in process space 14 may become coated with copper. Furthermore, the vaporizer plate 82 may also be coated with an undesired layer of copper. As such, in accordance with another principle of the present invention, a means for cleaning the walls and other conductive elements of the process chamber 12 may be necessary. One way of removing an undesired copper layer is to first oxidize the copper layer by the introduction of oxygen thereto, and then to utilize the organic (hfac) ligand chemical which will etch the oxidized copper. The (hfac) ligand, however, does not etch a metal copper layer and therefore the copper must first be oxidized. To that end, a supply of (hfac) 100 might be appropriately coupled within system 10, such as through lid 18, for introducing the (hfac) chemical into the process space 14, vaporization space 76, and other space therebetween.

Alternatively, a plasma activated clean might be utilized wherein HCl is introduced into the process space 14 and activated into a plasma through an electrode such as showerhead 80 which may be coupled to and biased by an RF power source 102. Periodic cleaning of the process space 14, vaporization space 76 and the spaces and elements therebetween will ensure clean, contaminant free metal deposition onto substrate 16.

In accordance with another principle of the present invention, the vaporizer plate 82 and process chamber 12 are coupled to a temperature control system for being selectively heated to obtain deposition on substrate 16 but to reduce recondensation of the vaporized precursor, and also to reduce copper deposition on the process chamber walls 97. To that end, the process chamber 12, and particularly the walls 97 of the chamber, are selectively heated by heating elements 103, which are coupled to the temperature control system 34. The temperature control system 34 provides independent control of the vaporizer plate 82, the chamber walls 97, and the stage 30. In that way, the process chamber walls 97 may be maintained at a temperature below which copper deposition will not occur. Simultaneously, the vaporizer plate 82 is heated to a temperature high enough to support large liquid precursor injection rates onto the vaporizer plate for vaporization without significant recondensation of the precursor. In accordance with one example of the present invention, the temperature control system operates to heat the vaporizer plate 82 to a temperature of approximately 60° C. which will vaporize the copper precursor from supply 70 to generate a vapor pressure of approximately 1.5 Torr (using a CupraSelect precursor). Process chamber 12 is, in turn, heated by elements 103 so that the internal process chamber walls 97 are maintained at a temperature which will generally be above 60° C. and below 90° C. If the walls are maintained above 60° C., or above the temperature of the vaporizer plate 82, recondensation on the walls 97 will generally be prevented. If the wall temperature is maintained below 90° C., deposition will generally be reduced on the chamber walls 97. Temperatures above 90° C. may produce deposition similar to the way in which deposition is produced on substrate 16. Generally, the temperature control system 34 will be operable to maintain the susceptor heating element 32 at a sufficient temperature for heating substrate 16 in the range of 130° C. to 200° C. to achieve the desired degree of copper deposition on the substrate. Accordingly, temperature control system 34 will maintain the process chamber walls approximately in the range of 60–90° C., in one example of the present invention. It will be readily understood that other temperature ranges may be utilized for other copper-containing precursors. However, the above-temperatures and ranges are typical of copper deposition utilizing the CupraSelect (hfac) Cu (TMVS) liquid precursor.

In accordance with another principle of the present invention, an edge exclusion ring 110 is positioned in the process space and is coupled to housing 11 to be positioned around the periphery of substrate 16. Referring to FIGS. 3 and 4, an edge exclusion ring structure is show positioned within the process space 14 around the peripheral edge of the substrate stage 30 and substrate 16. The edge exclusion ring is configured to surround the peripheral edge of the substrate when the substrate is in the process position, and may be formed of an electrically insulating material, such as quartz, to prevent deposition at the outer peripheral edge 112. The edge exclusion ring might also be a metal ring, or alternatively, a metal ring with an electrically insulative layer, such as a quartz layer, thereon. As illustrated in FIG. 4, a portion of the peripheral substrate edge extends below the inwardmost edge 114 of the edge exclusion ring. When the substrate stage 30 is raised to the process position, an upper peripheral edge 117 of the stage forms a seal with a lower edge 119 of the ring 110, separating the process space 14 from the buffer space 22. Ring 110 includes a gas cavity 116 formed therearound with a passage 118 which directs gas from cavity 116 beneath the ring 110 and toward the outer peripheral edge 112 of the substrate. A supply of an inert gas (not shown), such as argon, is coupled to cavity 116 such that the gas may be directed through the passage 118 over edge 112 of the substrate. A flow rate of approximately 100 sccm should be sufficient for maintaining the peripheral edge 112 of the substrate free from copper deposition. The space or gap between the ring edge 114 and the peripheral edge 112 of the substrate should be sufficiently small to maintain a vigorous gas velocity over the edge 112 to prevent reactant gases from entering into the gap 120 formed between the ring edge 114 and the substrate edge 112. In that way, copper deposition at the peripheral edge substrate 112 is reduced, thus reducing deposition onto a portion of the substrate 16 which is not sufficiently covered by a barrier layer, such as a tantalum or titanium nitride barrier layer as discussed hereinabove.

In an alternative embodiment of the invention, the susceptor stage 30 may be formed to include a peripheral gas cavity 122 which may be coupled to a supply (not shown) of an inert gas. Cavity 120 includes an upwardly extending passage 124 which will direct gas upward toward the bottom surface of the substrate 16, and thus over the outer peripheral edge 112 thereof. The substrate 16 will be appropriately clamped to susceptor 30 according to well known principles so that gas from passage 124 will not lift the substrate. Utilizing ring 110 to form a narrow gap 120 at the substrate edge 112, a vigorous inert gas velocity may be maintained through cavity 120 to prevent reactant gases from entering the gap 120, and thus prevent copper layer deposition at the peripheral edge 112 of the substrate 16. Cavity 122 and passage 124 could be appropriately fabricated within the susceptor 30.

The buffer chamber 20 has high volume pumping capabilities for purging the buffer space of contaminants in accordance with another aspect of the invention. To that end, as seen in FIGS. 1 and 2, a pumping system comprises one or more cryogenic panels 140 which are positioned adjacent to or forming part of the internal walls of the buffer chamber 20. The cryogenic panels 140 provide extremely high pumping speeds for many reactive contaminant gas species which may migrate from the process chamber 12 into the buffer chamber. The panels 140 will preferably have a large area with respect to the buffer space 22 of chamber 20. The panels are continually cooled and continually pump contaminants from space 22 by attracting the contaminant gas particles thereto. Therefore rapid pumping speeds are achieved with respect to the space 22. Such cryogenic panels 140 are generally suitable for pumping contaminants such as water, HCl, and $NH_3$. Cryogenic panels 140 are commercially available, and may be cooled either by coupling the panels to a supply of cryogenic fluids 142, or an expander head 144. With a cryogenic fluid supply 142, the fluids are recirculated through channels 143 in the panels 140 to provide continuous pumping of contaminants by the panels. Suitable cryogenic fluids are liquid nitrogen and/or refrigerants such as Freon. An expander head 144, on the other hand, will rely upon rapid expansion of a substance, such as liquid helium, to cause cooling. The cryogenic panels 140 are generally maintained in a temperature range between 100° and 150° Kelvin.

The panels 140 may not be sufficient to capture all of the contaminant gas species which may leak into buffer chamber 20 before the substrate is to be transported from buffer chamber 20. Therefore, in accordance with another embodiment of the present invention, the buffer chamber pumping system includes a high vacuum pump 52 for removing any additional contaminants not collected by the panels 140. The buffer chamber 20 is thus purged of contaminants before the substrate 16 is moved therefrom and into the transfer chamber 46 by the substrate transport device (not shown).

In accordance with another aspect of the present invention, a gas sensing system 146 is utilized for detecting the levels of contaminant gas species within buffer chamber 20. Gas sensing system 146 is operably coupled to isolation valve 28, as shown in the Figures, to prevent opening of the isolation valve 28 and transferring of the substrate out of the buffer chamber 24 and into a transfer chamber 46 if a large amount of contaminants still exist within the buffer chamber 24. Gas sensing system 146 may include a suitable sensor 147 which is positioned in the buffer space, such as a commercially available residual gas analyzer (RGA). Gas sensing system 146 might also utilize commercially available optical sensors and a plasma tube (not shown). For example, a plasma tube would be positioned in the buffer space and would excite contaminant gas particles, such as chlorine or fluorine ions, which are then detected by the optical sensors that are tuned to detect the excited states of those gas species. Other suitable sensing systems may also be utilized for gas sensing system 146.

A typical processing sequence utilizing the system 10 of the invention is helpful in disclosing how contamination between process chamber 12 and transfer chamber 46 is reduced. First, a substrate is moved into the transfer chamber 46 from an external location or other process chamber (not shown) by substrate transport device (not shown). The substrate is then ready to be processed in the process chamber 12. The sealing mechanism, such as gate valve assembly 50 will be closed, and isolation valve 28 is opened. The substrate is then loaded onto the susceptor 30, which is in the buffer position as shown in FIG. 2. The substrate transport device (not shown), such as a robot arm, will then exit through the isolation valve 28 and the isolation valve is closed. Next, the gate valve assembly 50 is opened and the substrate stage 30 is vertically raised to the process position, as illustrated in FIG. 1. Gate valve assembly 50 is not opened for moving the substrate 16 and a portion of stage 30 through passage 26 until the isolation valve is closed. Simultaneous with movement of the substrate stage 30, the pressure within the buffer chamber 20 is raised or lowered in order to match the pressure within the process chamber 12. If the pressure within buffer chamber 20 needs to be lowered, the vacuum pump 52 is utilized to purge the buffer chamber. The substrate stage 30 is then raised into the process position, as shown in FIG. 1. In that way, passage 26 is sealed to isolate the process chamber 12 from the buffer chamber 20.

After the substrate has been positioned in the process chamber 12, the process is run. After the process is run, the process space 14 is initially purged, such as by vacuum pump 42. Such purging will remove a large amount of the contaminants which may migrate through the multi-chamber system. However, the buffer chamber 20, in accordance with one aspect of the present invention, will further reduce contaminant species which may migrate to other process chambers. After process space 14 is purged, stage 30 is lowered, thus opening passage 26. Gate valve assembly 50 is then closed to isolate the buffer space from the process space. The cryogenic panels 140 and vacuum pump 52 are utilized to pump and purge the buffer space 22 of contaminants. The buffer space 22 has been exposed to gases from the process chamber 12, and thus those gases must be removed to reduce and prevent contamination. The buffer space is purged independently of the process space because of the closed gate valve assembly. The gas sensing system 146 is utilized to verify that the contaminant level within the process space 22 is acceptably low. If the contaminant level is low enough, isolation valve 28 is opened, and the substrate transport device (not shown) removes the substrate from buffer chamber 20, and moves it to additional processing chambers or completely out of the processing system.

The present invention is particularly useful for isolating a CVD processing chamber from a PVD processing chamber within a multi-chamber processing tool. The CVD processing chamber will generally be maintained at a higher pressure. Thus contaminant gas species therefrom will tend to migrate to the lower pressure PVD chamber. With the invention, a PVD chamber may be integrated with the CVD system of the invention. A PVD chamber for depositing tantalum, for example, might be integrated with system 10 through a common transfer chamber 40 so that a barrier layer may be deposited on a substrate before copper is deposited.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A system for depositing a layer of metal onto a substrate through a chemical vapor deposition process, the system comprising:
   a process chamber having a process space therein for receiving and processing a substrate;
   a vaporizer element positioned in a vaporization space of the chamber adjacent the process space, the vaporizer element operable for being heated to a temperature sufficient to vaporize a liquid metal-containing precursor into a process gas for delivery to said process space;
   a nozzle positioned opposite said vaporizer element and connectable to a liquid metal-containing precursor supply, the nozzle operable to atomize and direct the liquid metal-containing precursor to directly strike against the vaporizer element so that the precursor may be vaporized into the process gas;
   a vapor distribution ring positioned between the vaporization space and the process space to disperse the formed process gas into the process space and proximate the substrate, the vapor distribution ring spaced away from the vaporizer element such that the precursor may be predominantly vaporized into a process gas by the vaporizer element before being dispersed through the vapor distribution ring into the process space;
   whereby the gas reacts proximate the substrate to deposit a layer of metal thereon.

2. The system of claim 1 further comprising a supply of a liquid copper-containing precursor connected to the nozzle.

3. The system of claim 1 wherein said vaporizer element comprises a metal plate which is directly heated to vaporize the precursor.

4. The system of claim 3 wherein said metal plate includes an indentation to capture said precursor directed thereagainst by said nozzle.

5. The system of claim 1 further comprising a valve and a liquid mass flow meter, the valve connectable between a liquid metal-containing precursor supply and said nozzle to control the flow of a liquid precursor to the nozzle, the mass flow meter being operably coupled to the valve to control the operation of the valve and the precursor flow.

6. The system of claim 1 further comprising a pump operably connectable between a liquid metal-containing precursor supply and said nozzle for delivering a precursor from said supply to the nozzle when the supply is connected to the pump.

7. The system of claim 1 wherein said vapor distribution ring includes holes to pass gas through the ring, the density of holes proximate one position on the ring varying from the density of holes proximate another position on the ring.

8. The system of claim 1 further comprising a showerhead positioned proximate the vapor distribution ring to disburse the process gas in the process space.

9. The system of claim 1 wherein said process chamber includes a heating element for heating internal walls of said chamber, the apparatus further comprising a temperature control system operably coupled to said vaporizer element and said heating element for differentially heating the vaporizer element and chamber walls to simultaneously reduce both condensation of a vaporized precursor and deposition on the chamber walls.

10. The system of claim 9 wherein said temperature control system is operable to maintain the temperature of said vaporizer element at approximately 60° C.

11. The system of claim 9 wherein said temperature control system is operable to maintain the temperature of said chamber walls approximately in the range of 60° C. to 90° C.

12. The system of claim 1 wherein said vapor distribution ring includes holes to pass through the ring, the density of holes proximate one position on the ring varying from the density of holes proximate another position on the ring.

13. The system of claim 1 further comprising an edge exclusion ring positioned in the process space, the edge exclusion ring configured for surrounding a peripheral edge of a substrate in the process space to prevent deposition at said substrate peripheral edge.

14. The system of claim 13 wherein said edge exclusion ring includes a gas passage, the passage configured for directing gas inwardly of said ring to prevent deposition at said substrate peripheral edge.

15. A system for depositing a layer of metal onto a substrate through a chemical vapor deposition process, the system comprising:
   a process chamber having a process space therein for receiving and processing a substrate and including a heating element for heating internal walls of said chamber;
   a vaporizer element positioned in a vaporization space of the chamber adjacent the process space, the vaporizer element operable for being heated to a temperature sufficient to vaporize a liquid metal-containing precursor into a process gas for delivery to said process space;
   a gas-dispersing element including a vapor distribution ring positioned between the vaporization space and the process space to disperse the formed process gas into the process space and proximate the substrate, the vapor distribution ring spaced away from the vaporizer element such that the precursor may be predominantly vaporized into a process gas by the vaporizer element before being dispersed through the vapor distribution ring into the process space;
   a temperature control system operably coupled to said vaporizer element and said heating element for differentially heating the vaporizer element and chamber walls to simultaneously reduce both condensation of a vaporized precursor and deposition on the chamber walls;
   whereby a gas may react proximate the substrate to deposit a layer of metal thereon.

16. The system of claim 15 wherein said temperature control system is operable to maintain the temperature of said vaporizer element at approximately 60 degrees C.

17. The system of claim 15 wherein said temperature control system is operable to maintain the temperature of said chamber walls approximately in the range of 60 to 90 degrees C.

18. The system of claim 15 further comprising a nozzle positioned opposite said vaporizer element and connectable to a liquid precursor supply, the nozzle operable to atomize and direct a liquid precursor into the vaporization space and against the vaporizer element.

19. The system of claim 15 further comprising an edge exclusion ring positioned in the process space, the edge exclusion ring configured for surrounding a peripheral edge of a substrate in the process space to prevent deposition at said substrate peripheral edge.

20. The system of claim 19 wherein said edge exclusion ring includes a gas passage, the passage configured for directing gas inwardly of said ring to prevent deposition at said substrate peripheral edge.

21. An apparatus for depositing a layer of copper onto a substrate through a chemical vapor deposition process within a processing system having multiple process chambers, the apparatus comprising:
   a process chamber having a process space therein for receiving and processing a substrate;
   a vaporizer element positioned in a vaporization space of the chamber adjacent the process space and connectable to a liquid metal-containing precursor supply, the vaporizer element operable for being heated to a temperature sufficient to vaporize a liquid metal-containing precursor into a gas for delivery to said process space;
   a vapor distribution ring positioned between the vaporization space and the process space and spaced away from the vaporizer element to disperse the gas from the vaporized precursor into the process space and proximate the substrate;
   a buffer chamber defining a buffer space therein, the buffer chamber positioned beneath the process chamber;
   a passage formed between the process and buffer chambers for moving a substrate between the process space and buffer space;
   a movable substrate stage positioned in the buffer space and configured for receiving a substrate, the substrate stage operable for moving vertically in said passage between a first position wherein the substrate is positioned in the buffer space and a second position wherein the substrate is positioned within the process space of the process chamber;

a sealing mechanism engaging the passage, the sealing mechanism operable to seal the passage and isolate the process space from the buffer space when the substrate stage is in the first position, the sealing mechanism further operable to unseal the passage so the substrate stage may be moved to the second position;

a pumping system coupled to the buffer chamber for purging the buffer space of contaminants which may leak from the process chamber;

whereby to generally reduce the escape of the contaminants through the buffer chamber and into the other process chambers of a multiple chamber system.

22. The apparatus of claim 21 wherein said pump system comprises a cryogenic panel positioned adjacent a wall of the buffer chamber, the cryogenic panel operable for capturing and thereby pumping gas from the buffer chamber to reduce contaminants in the buffer chamber.

23. The apparatus of claim 22 wherein said cryogenic panel is thermally coupled to a source of refrigerant for cooling said panel to effect pumping of the gas.

24. The apparatus of claim 22 wherein said cryogenic panel is thermally coupled to an expander head, the expander head operable for rapidly expanding a coolant gas for cooling said panel to effect pumping.

25. The apparatus of claim 21 further comprising a gas sensing system operably coupled to the buffer chamber for detecting undesired gases to be removed by the pumping system from the buffer chamber.

26. The apparatus of claim 25 wherein said gas sensing system includes a plasma tube operable for exciting gas species and an optical sensor to detect the excited species.

27. The apparatus of claim 21 wherein said pumping system further includes a cryogenic pump for removing contaminants and water from the process.

28. The apparatus of claim 21 wherein said pumping system further includes a cryogenic water pump for removing water.

* * * * *